April 20, 1965 J. B. GUNN 3,178,797

SEMICONDUCTOR DEVICE FORMATION

Filed June 12, 1961

INVENTOR
JOHN B. GUNN

BY John F. Ohlandt Jr.
ATTORNEY

United States Patent Office 3,178,797

Patented Apr. 20, 1965

3,178,797

SEMICONDUCTOR DEVICE FORMATION

John B. Gunn, Yorktown Heights, N.Y., assignor to International Business Machines Corporation, New York, N.Y., a corporation of New York Filed June 12, 1961, Ser. No. 116,343
3 Claims. (Cl. 29—25.3)

Figure 1:
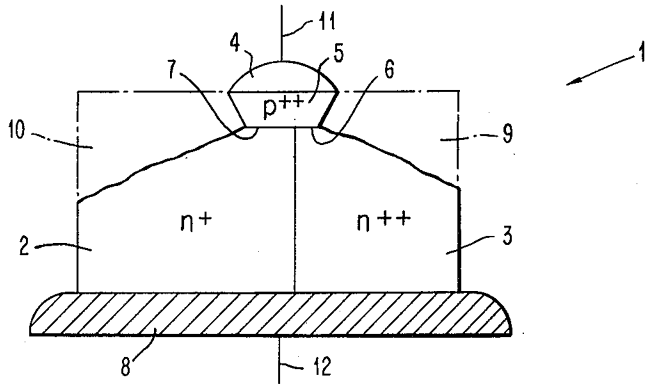

This invention relates to the fabrication of semiconductor devices and more particularly to the fabrication of devices which have come to be known as tunnel diodes.

A new semiconductor device which depends upon the phenomenon of quantum mechanical tunneling has been described in the literature by Leo Esaki in the Physical Review, Volume 109, January 1958. This device includes a PN junction joining two regions of semiconductor material having very high conductivity. The conductivity of the regions is such that one region is degenerate and the other region approaches degeneracy so that under zero bias conditions, the conduction band on one side of the junction overlaps the valence band on the other side of the junction. Degeneracy may be defined as an impurity concentration sufficient to cause the Fermi level to rise within the valence or conduction band. Since the phenomenon of quantum mechanical tunneling is an electron wave function which decreases rapidly with distance, it is necessary that the PN junction, that is, the distance in the crystal from the high conductivity region of one type through the space charge layer and back to the high conductivity of the opposite type, be very small. For germanium this distance is on the order of 150 angstrom units or less. The voltage-current characteristic exhibited by a device that meets the criteria set forth above has two regions of positive resistance at low and high values of voltage and a transitional negative resistance region at intermediate values of voltage between the two positive resistance regions.

Because of its many valuable attributes, such as negative resistance, ability to withstand high temperatures, insensitivity to radiation, etc., the tunnel diode has come to the forefront of important new devices for use in computers. However, in the mass fabrication of these devices, many practical problems are presented. These are chiefly due to the fact that a very small physical size is called for so that it is very diffcult to fabricate devices en masse and yet have a reasonable degree of certainty that the parameters of the devices will be within strict tolerance requirements.

An important criterion or figure of merit that has become established for the tunnel diode is the $I_p/C$ ratio where $I_p$ represents the peak current that is present just before the voltage-current characteristic curve exhibits the negative resistance and C is the capacitance of the diode. When it is desired to operate the tunnel diode in circuits at very high speeds and with low power dissipation, a necessary condition imposed is that the peak current be small. At the same time, it is necessary to reduce the capacitance of the device so as to preserve a high ratio of $I_p$ to C. However, when these devices are being produced on a mass scale, although standard etching techniques may be employed to reduce the junction area of the device, thereby effectively reducing the peak current to the desired value, there will not necessarily be produced concomitantly for all the devices such a value of capacitance that the $I_p/C$ ratio of the devices will match. Furthermore, when the fabricated tunnel diodes are to be used in special logic or memory circuits, such as proposed by Goto in what has come to be known as a twin arrangement, the $I_p/C$ ratio must be very rigidly controlled in order that the circuits function properly.

What has been discovered is a technique of fabricating tunnel diodes in a special structural configuration whereby reproducibility and easy matching of these diodes is obtained. It has been found that if a composite type of semiconductor structure is initially formed, that is, one containing both a tunnel diode device and in shunt therewith a simple diode, which may be a "backward" or a normal diode, one can thereafter so tailor the structure that the finally realized composite device will have the requisite tunnel diode characteristic in the forward direction and the device will have a very simply adjusted value of peak current and, at the same time, an independently adjusted value of capacitance. By reason of the advantageous ability to tailor the device that is afforded by the technique of the present invention, a facility for matching a plurality of such devices in respect of their peak currents and capacitances is attained.

Accordingly it is an object of the present invention to provide a technique that enables ready reproducibility of tunnel diodes on a mass scale.

Another object is to provide a simple technique for matching the peak currents and capacitances of tunnel diodes.

A further object is to produce pursuant to the technique of the present invention a novel composite semiconductor junction device.

The foregoing and other objects, features and advantages of the invention will be apparent from the following more particular description of a preferred embodiment of the invention, as illustrated in the accompanying drawings.

In the drawings:

FIG. 1 is a schematic view of a composite tunnel diode semiconductor device.

Figure 2A:
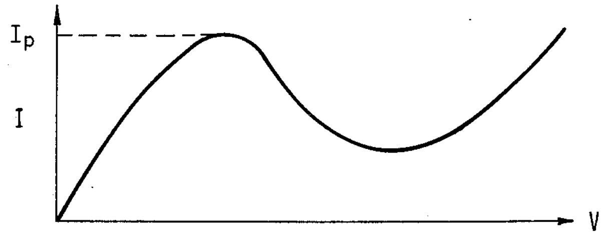
Figure 2B:
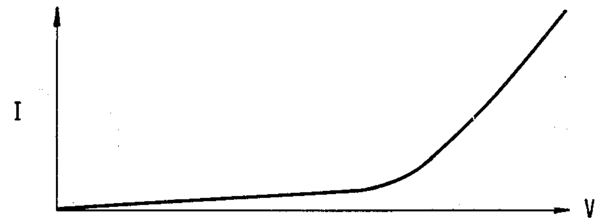
Figure 2C:
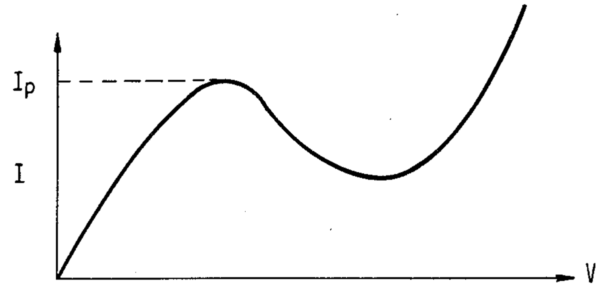

FIGS. 2A, 2B, and 2C illustrate the various voltage-current characteristics of the several parts of the composite device of FIG. 1.

Referring now to FIG. 1, a semiconductor body generally denoted by reference numeral 1 is illustrated as having two regions 2 and 3 within the crystal structure. The entire body is initially formed so as to have a uniform impurity distribution throughout as denoted by the symbol n+. The region 3 is produced in a manner well known in the art, such as by the technique of vapor diffusion where a suitable impurity, such as arsenic, is permitted to diffuse into the semiconductor body to an extremely high density. The region 3 thus becomes degenerate and this condition is denoted by the symbol n++. Of course, other techniques known to workers versed in the semiconductor art may be employed to obtain the regions 2 and 3. Onto one surface of semiconductor body 1 an alloy dot 4 containing suitable acceptor impurities is affixed so as to overlay regions 2 and 3. In accordance with a standard alloy operation, the entire assembly is heated up to a suitable temperature whereby a portion of the surface of the body is dissolved and the impurity, such as gallium, is admixed in the molten pool created by the heating. Upon cooling down the assembly, because of the high level of the acceptor impurity that is used, a degenerate recrystallized area of p conductivity-type denoted by the symbol p++ is created within the body 1, overlaying regions 2 and 3. The recrystallized region is labelled 5 in the figure. Considering the regions together, there is formed on the right of the structure a tunnel diode device made up of regions 3 and 5 with the junction of that device generally indicated by numeral 6. On the left of the structure there is formed, depending on the doping density used, a "backward" or a normal diode, constituted of regions 2 and 5, with the junction of this device generally indicated by numeral 7. An ohmic contact 8 is now made to the opposite surface of the body in a manner well known and suitable conductors 11 and 12 are attached to the formed contacts for circuit connecting purposes.

Referring now to FIG. 2A, there is illustrated the voltage-current characteristic exhibited by the tunnel diode part of the structure of FIG. 1, that is, the portion on the right which comprises n++ region 3 and p++ region 5. As described heretofore, this characteristic has two positive resistance regions with an intermediate negative resistance region.

In FIG. 2B the voltage-current characteristic for the lefthand portion of FIG. 1 is illustrated, that is the portion which comprises n+ region 2 and p++ region 5. This type of characteristic is a typical one for a backward diode. The backward diode characteristic so exhibited has been realized because the impurity concentration of the region 2 has been selected, in this example, to be slightly less than degenerate. As is evident from the curve, a very high impedance exists for the backward diode up to a voltage value which is high compared to the voltage value at which the tunnel diode exhibits its negative resistance. Once this level has been exceeded, a low impedance is manifested by the backward diode device with a consequent sharp rise in current with increasing voltage thereafter.

The voltage-current characteristic of FIG. 2C is a composite characteristic for both diodes taken together, that is, since the tunel diode on the right and the backward diode on the left are in shunt connection, the characteristic for the total device is a resultant of the individual characteristics plotted by taking sucessive values of voltage and by taking the sum of the individual currents corresponding to these voltage values. It will be appreciated from the figures that the peak current for the composite characteristic is substantially identical with the peak current of the voltage-current characteristic illustrated in FIG. 2A since very small values of current exist for the backward diode in the critical region of interest as may be noted from FIG. 2B. If a lower impurity density had been used, a "normal diode" characteristic would have been obtained, but essentially the same composite characteristic as in FIG. 2C would have resulted.

Having fabricated the structure illustrated in the dash line of FIG. 1, the next step is to etch away portions of both the tunnel diode part and the backward diode part of the composite device. This may be done by a standard technique of jet etching. The etching of the righthand part of the structure is continued until the desired value of peak current is obtained. This etching away of the structure is indicated by the broken lines surrounding section 9. In a similar manner, and as is illustrated by the broken lines surrounding section 10, the lefthand part of the structure is now etched away. With the latter etching step, the aim is merely to produce a change in the capacitance of the backward diode part of the structure and hence of the capacitance of the composite device. There will be effectively no change in the peak current value that has been previously obtained as a result of this etching step. Thus by individual steps control of the peak current has been realized and an independent control of the capacitance of the total device.

What has been described in accordance with the teaching of the present invention is a simple technique which facilitates matching of tunnel diodes in respect of their peak currents and capacitances in individually controlled steps so as to enable reproducibility on a mass scale. Pursuant to this technique a novel composite type of semiconductor structure has been fabricated.

While the invention has been particularly shown and described with reference to a preferred embodiment thereof, it will be understood by those skilled in the art that various changes in form and details may be made therein without departing from the spirit and scope of the invention.

What is claimed is:

1. A process for enabling the matching of the $I_p/C$ ratio of a plurality of tunnel diode devices comprising, fabricating a semiconductor body having at least two immediately contiguous regions, the second region of which is degenerately doped; converting contiguous portions of said at least two regions within said body to a quantity of degenerate semiconductor material so as to form with said first region a simple diode junction device, having a junction area, and to form with said second degenerate region a tunnel diode junction device, having a junction area, thereby to form an integral composite device; making ohmic contact to the surface opposite said contiguous portions, whereby said individual devices are effectively connected in shunt; separately etching the junction area of said tunnel diode device and the junction area of said simple diode device, thereby to adjust independently the value of peak current and the value of capacitance of the composite device.

2. A process for enabling the matching of the $I_p/C$ ratio of a plurality of tunnel diode devices comprising, fabricating a semiconductor body having at least two immediately contiguous regions, the second region of which is degenerately doped; converting contiguous portions of said at least two regions within said body to a quantity of degenerate semiconductor material so as to form with said first region a backward diode junction device, having a junction area, and to form with said second degenerate region a tunnel diode junction device, having a junction area, thereby to form an integral composite device; making ohmic contact to the surface opposite said contiguous portions, whereby said individual devices are effectively connected in shunt; separately etching the junction area of said tunnel diode device and the junction area of said backward diode junction device, thereby to adjust independently the value of peak current and the value of capacitance of the composite device.

3. A process for enabling the matching of the $I_p/C$ ratio of a plurality of tunnel devices comprising, fabricating a semiconductor body having at least two immediately contiguous regions of a given conductivity type, the second region of which is degenerately doped; alloying contiguous surface portions of said at least two regions with a substance containing an impurity which is opposite conductivity type determining, thereby to create within said body a quantity of degenerate semiconductor material of opposite conductivity type so as to form with said first region a simple diode junction device, having a junction arm, and to form with said second degenerate region a tunnel diode junction device, having a junction area, thereby to form an integral composite device; making ohmic contact to the surface opposite said contiguous portions, thereby to connect said simple diode junction device and said tunnel diode junction device in shunt; separately etching the junction area of said tunnel diode device and the junction area of said simple diode device thereby to adjust independently the value of peak current and the value of capacitance of the composite device.

References Cited by the Examiner

UNITED STATES PATENTS

| | | | |
|---|---|---|---|
| 2,937,114 | 5/60 | Shockley | 317—235 |
| 3,027,501 | 3/62 | Pearson | 317—234 |
| 3,079,512 | 2/63 | Rutz | 148—177 |

OTHER REFERENCES

IBM Technical Disclosure Bulletin by Anderson, vol. 2, No. 3, October 1959.

RICHARD H. EANES, Jr. *Primary Examiner.*

JAMES D. KALLAM, WHITMORE A. WILTZ, *Examiners.*